(12) United States Patent
Bertolotti

(10) Patent No.: US 11,852,122 B2
(45) Date of Patent: Dec. 26, 2023

(54) ELECTRICAL POWER SYSTEM FOR WIND TURBINE BLADES

(71) Applicant: NIDEC SSB WIND SYSTEMS GMBH, Salzbergen (DE)

(72) Inventor: Fabio Bertolotti, Bad Bentheim (DE)

(73) Assignee: NIDEC SSB WIND SYSTEMS GMBH, Salzbergen (DE)

( * ) Notice: Subject to any disclaimer, the term of this patent is extended or adjusted under 35 U.S.C. 154(b) by 0 days.

(21) Appl. No.: 17/810,455

(22) Filed: Jul. 1, 2022

(65) Prior Publication Data

US 2023/0010346 A1  Jan. 12, 2023

(30) Foreign Application Priority Data

Jul. 9, 2021 (EP) .................................... 21184920

(51) Int. Cl.
*F03D 80/30* (2016.01)
*F03D 9/25* (2016.01)
(Continued)

(52) U.S. Cl.
CPC .......... *F03D 80/30* (2016.05); *F03D 1/0675* (2013.01); *F03D 9/25* (2016.05); *F03D 17/00* (2016.05);
(Continued)

(58) Field of Classification Search
CPC ......... F03D 80/30; F03D 17/00; H02G 13/00; H02G 13/40; H02G 13/60; H02G 13/80; G01R 29/0842
See application file for complete search history.

(56) References Cited

U.S. PATENT DOCUMENTS

| 8,456,790 B2 * | 6/2013 | Tanaka | H05H 1/2406 |
| | | | 361/111 |
| 8,643,997 B2 * | 2/2014 | Lyngby | H02H 7/24 |
| | | | 361/117 |

(Continued)

FOREIGN PATENT DOCUMENTS

| DE | 10 2011 014537 B3 | 5/2012 |
| EP | 3 076 015 A1 | 10/2016 |
| WO | WO-2020/259777 A1 | 12/2020 |

OTHER PUBLICATIONS

European Search Report issued in EP EP21184920.3, dated Dec. 2, 2021, 7 pages.

*Primary Examiner* — Justin D Seabe
*Assistant Examiner* — Behnoush Haghighian
(74) *Attorney, Agent, or Firm* — HARNESS, DICKEY & PIERCE, PLC

(57) ABSTRACT

A wind turbine (10) is disclosed having a hub (14) with electrical power therein and at least one blade (20) attached to the hub. The blade (20) has a blade root (21), a blade tip (26) and a down-wire (30) for the conduction of lightning current to the ground. The wind turbine (10) further has a blade electrical system (99) that takes electrical power from the hub (14) and transmits electrical power into the blade (20) to at least one area located between the blade root (21) and the blade tip (26). The blade electrical system (99) if formed by a power-transfer unit (100) having a power-driver unit (110), a power-conditioner unit (130) and a dielectric (120) separating the power-driver unit (110) and the power-conditioner unit (130). The power-driver unit (110) receives electrical power from the hub (14) and transmit the electrical power through the dielectric (120) to the power-conditioner unit (130). An electrical-power bus (200) is electrically attached to the power-conditioner unit (130) and extends into the blade (20). At least one powered unit (300) is (Continued)

provided which is electrically connected to, and electrically powered by, the electrical-power bus (200).

18 Claims, 9 Drawing Sheets

(51) Int. Cl.
    *F03D 1/06*          (2006.01)
    *G01R 29/08*       (2006.01)
    *H02G 13/00*      (2006.01)
    *F03D 17/00*      (2016.01)

(52) U.S. Cl.
    CPC ... *F05B 2220/7062* (2013.01); *F05B 2240/85* (2020.08); *G01R 29/0842* (2013.01); *H02G 13/00* (2013.01); *H02G 13/40* (2013.01); *H02G 13/60* (2013.01)

(56) References Cited

U.S. PATENT DOCUMENTS

| | | | |
|---|---|---|---|
| 10,982,656 B2 * | 4/2021 | Andersen | H02G 13/40 |
| 2018/0010583 A1 * | 1/2018 | Andersen | H01R 4/66 |
| 2022/0228571 A1 * | 7/2022 | Brilliant | F03D 80/30 |

* cited by examiner

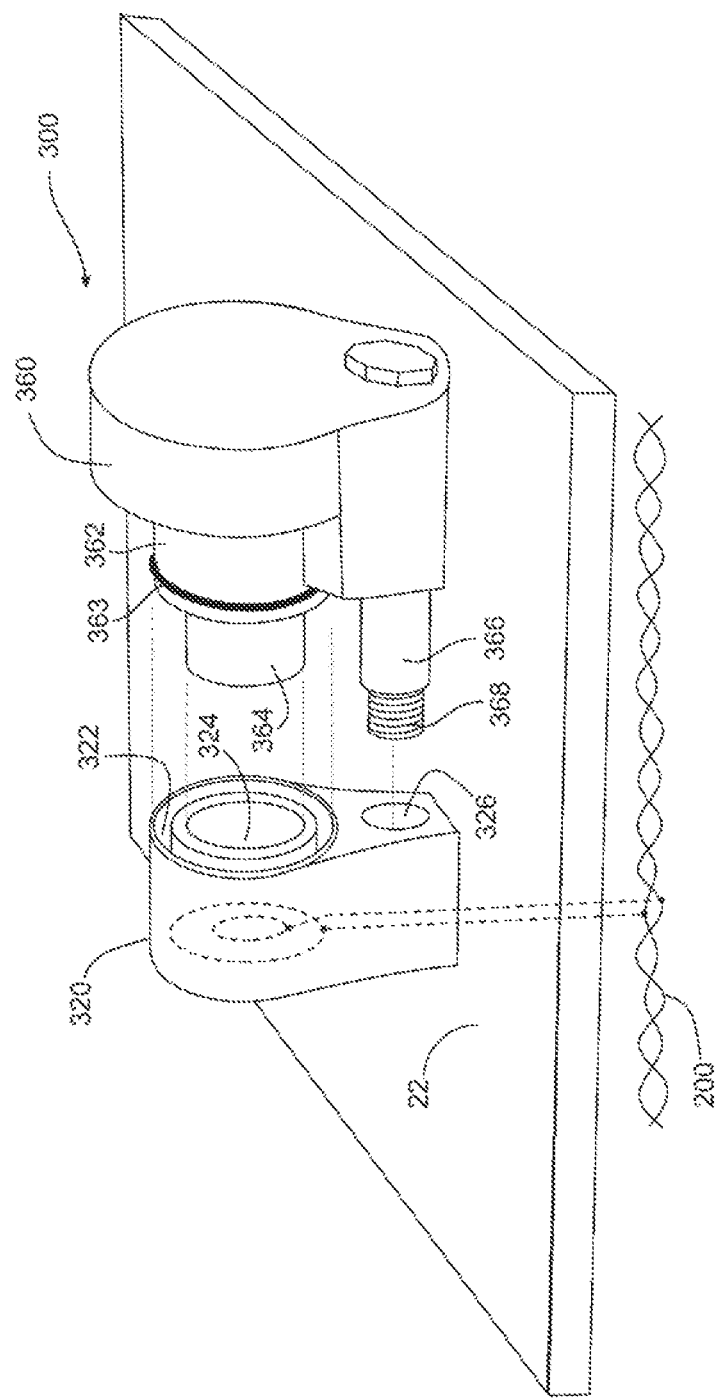

ELECTRICAL POWER SYSTEM FOR WIND TURBINE BLADES

CROSS-REFERENCE TO RELATED APPLICATIONS

This application claims priority to European Patent Application No. 21184920.3, filed Jul. 9, 2021, the disclosures of which are herein incorporated by reference in their entirety.

TECHNICAL FIELD

This invention relates to a system for providing electrical power to a wind turbine blade, and includes powered units using said provided power and performing sensing, measurement, and control functions. In particular, the invention relates to a wind turbine having a hub with electrical power therein and at least one blade attached to the hub, the blade having a blade root, a blade tip and a down-wire for the conduction of lightning current to the ground.

BACKGROUND ART

Wind turbines change the energy of the wind into electrical energy, and, thus, contain an electrical system with both power components, like the generator, as well as control components, such as the central programmable logic controller.

Wind turbine blades are subjected to large loads throughout their life due to the variable nature of the wind. Accordingly, measurements of blade deflection, blade loads, and blade material and aerodynamic values are desired to maximize the power extracted from the wind, for minimizing loads that reduce the life-time of the wind turbine, and for monitoring the health of the blade.

As turbine blades get longer, it is also desirable to incorporate aerodynamic appendages, such as ailerons and flaps, to enable faster reaction times than possible with pitch-angle systems currently used in the art, thereby providing better control over the wind loading on the blade.

Wind turbine blades reach high into the sky, and are a prime target for lightning strikes. Modern turbines have a lightning protection system that protects the blades against lightning strikes of strength lower than a predetermined amount. After the lightning strike attaches to the surface of the blade at a lightning attachment point, an electrically conductive down-wire inside the blade safely guides the current to the wind turbine tower and down to the ground. The inside of the blade, however, receives a large magnetic and electric pulse generated by the lightning current.

Electrical and electronic equipment is the lowest cost and best performing sensing and actuation equipment available in the market, but it has only been used in wind turbine blades at locations near the blade root region to avoid being damaged by the magnetic and electric pulse generated by a lightning strike, or the direct damage occurring when part of the lightning current flashes over to the electrical or electronic equipment.

What is needed, is an electrical power system that can safely bring electrical power to locations inside the blade, up to, and including, the blade's near tip region, and, furthermore, to survive lightning strike, without producing large voltages at the electrical and electronic equipment receiving the electrical power. Additionally needed are sensors and actuators located inside the blade and powered by said electrical power system.

It is also desirable for the electrical power system to have essentially no detrimental influence on the layout or functionality of the existing lightning protection system in the blade.

While we describe the invention in relation to a wind turbine it is obvious to a skilled person in the art that the electrical power system described herein can be applied to and incorporated into any structure exposed to lightning strikes, including cranes, bridges, ship masts, and the like.

SUMMARY OF INVENTION

A wind turbine according to the invention has a hub with electrical power therein and at least one blade attached to the hub, the blade having a blade root, a blade tip and a down-wire for the conduction of lightning current to the ground. Further, the wind turbine has a blade electrical system that takes electrical power from the hub and transmits electrical power into the blade to at least one area located between the blade root and the blade tip. The blade electrical system comprises:

- a power-transfer unit comprising a power-driver unit, a power-conditioner unit and a dielectric separating the power-driver unit and the power-conditioner unit, the power-driver unit receiving electrical poi e or the electrical power from the hub and transmitting the electrical power, through the dielectric to the power-conditioner unit,
- an electrical-power bus, electrically attached to the power-conditioner unit and extending into the blade, and
- at least one powered unit electrically connected to, and being electrically powered by, the electrical-power bus.

Preferentially, the above-mentioned expression "with electrical power therein" in connection with the hub means that electrical power is provided in or within the hub. Preferably, the electrical power is provided by an electrical grid of the wind turbine. Particularly, the dielectric electrically separates the power-driver unit and the power-conditioner unit. Preferentially, the dielectric separates or electrically separates the power-driver unit and the power-conditioner unit from one another.

Preferably, the dielectric has dielectric strength sufficient to resist the voltage potential in the down-wire with respect to ground during a lightning strike. For instance, the dielectric is made from Polytetrafluoroethylene (Teflon).

In particular, the powered unit is arranged in the area located between the blade root and the blade tip. Preferentially, the powered unit is located inside the blade.

Preferably, the hub rotates or is rotatable about a rotor axis. Preferentially the wind turbine has a tower, supporting a nacelle, the hub being rotationally attached to the nacelle to allow revolution about the or a rotor axis. In particular, a direction perpendicular to the rotor axis is referred to as radial direction.

Preferably, the length of the blade defines a blade axis. In particular, the blade axis extends radially or essentially radially from the hub. For instance, the blade axis runs perpendicular or essentially perpendicular to the rotor axis. Preferably, a bearing connects the blade root of the blade to the hub to allow blade rotation along or about the blade axis.

Preferably, the dielectric comprises a separation part, located between the power-driver unit and the power-conditioner unit, and a surrounding part, encompassing the entire power-transfer unit.

According to a first variant, the power-driver unit comprises a first coil, and the power-conditioner unit comprises a second coil, wherein the first and second cons are separated from one another by means of the dielectric. Preferably, the power-driver unit comprises a coil driver, the first coil being connected to the coil driver. Preferentially, the power-conditioner unit comprises a rectifier, the rectifier being connected to the second coil. In particular, an alternating current with a predetermined frequency is produced by the coil-driver and passed through the first coil to induce a time varying voltage and/or current into the second coil, and wherein the induced current is passed to the rectifier to produce direct current in the electrical-power bus. Preferably, the first and second coils form a resonant system having a resonant frequency, wherein the frequency of the current produced by coil-driver is chosen to equal the resonant frequency.

According to a second variant, the power-driver unit comprises a motor driver and an electrical motor, driven by the motor-driver, and the power-conditioner unit comprises an electrical generator, rotationally coupled to the electrical motor and driven by the electrical motor to generate electrical voltage and/or current.

Preferably, the power-conditioner unit comprises a rectifier, the rectifier being connected to the electrical generator. For instance, an alternating current is produced by the electrical generator, wherein this alternating current is passed to the rectifier to produce direct current in the electrical-power bus.

Particularly, the dielectric comprises an insulating shaft rotationally coupling the electrical motor to the electrical generator. For instance, the separation part takes the form of the insulating shaft. Preferably, the dielectric comprises a volume filler that surrounds the insulating shaft, leaving a gap between itself and the shaft. Preferentially, the gap between the volume filler and the insulating shaft is filled with air or electrically isolating oil.

Preferably, the insulating shaft is oriented parallel to the rotor axis. Particularly, the insulating shaft is oriented parallel to the rotor axis when a blade pitch angle of the blade is at a nominal value. Preferentially, the insulating shaft is oriented perpendicular or essentially perpendicular to the blade axis.

According to an embodiment, the electrical-power bus comprises a pair of twisted cables. For instance, the cables of the pair of twisted cables are referred to as twisted-pair cables. Preferably, the pair of twisted cables is surrounded by a metallic shield.

In particular, the electrical-power bus is located in the blade along a path that maintains a minimum predetermined distance from the blade's down-wire. Preferably, the electrical-power bus runs parallel or essentially parallel to the down-wire. Preferentially, the electrical-power bus runs in the neighborhood of the down-wire. Particularly, the electrical-power bus runs at a distance to the down-wire that is much smaller than the length of the blade.

According to a first alternative embodiment, the electrical-power bus is not in electrical connection with the down-wire.

According to a second alternative embodiment, each cable of the pair of twisted cables is electrically connected to the down-wire at a first or common connection-point using a resistive connection.

According to a third alternative embodiment,
a first cable of the pair of twisted cables is electrically connected to the down-wire at a first connection-point using a first resistive connection, and
a second cable of the pair of twisted cables is electrically connected to the down-wire at a second connection-point using a second resistive connection, wherein the first and second connection points are spaced apart by a pre-determined distance.

Preferably, the blade electrical power system comprises a lightning detector and lightning-current measuring system, the lightning detector and lightning-current measuring system being in electrical contact with both cables of the pair of twisted cables in the electrical-power bus. In particular, lightning detector and lightning-current measuring system continuously measures a differential voltage potential between these twisted-pair cables. Preferentially, the lightning detector and lightning-current measuring system is located in, or near, the power-conditioner.

Preferably, a further or third resistive connection connects the metallic shield to the down-wire. In particular, the further or third resistive connection connects the metallic shield to the down-wire at the first or common connection point.

According to an embodiment, the powered unit comprises at least one sensor for sensing at least one physical quantity associated with the blade. In particular, the physical quantity is associated with the blade at the location of the sensor. For instance, the sensor is or comprises a pressure sensor or differential pressure sensor. For instance, the physical quantity is pressure or air pressure.

According to a further embodiment, the blade is provided with an aerodynamic appendage. Preferably, the mechanical power needed for moving the aerodynamic appendage is supplied by a fluid-power system. Preferentially, the fluid-power system is controlled by the powered unit. Particularly, the powered unit is located near the aerodynamic appendage. Preferably, the fluid-power system delivers working fluid to the location of the aerodynamic appendage via a fluid conduit. In particular, the working fluid has fluid power. For instance, the aerodynamic appendage is a flap, an aileron, or a Gurney flap.

According to a yet further embodiment, the electrical-power bus comprises a docking port fixedly attached to the blade structure, such as, for example, a spar, and electrically connected to the electrical-power bus. Preferably, the docking port receives the powered unit. Particularly, the docking port provides both mechanical support to the powered unit as well as electrical contact between the powered unit and the electrical-power bus. Preferably, the docking port has a first channel adopted to receive a first plug on the powered unit, and a second channel adopted to receive a second plug on the powered unit.

Preferentially the first channel and the first plug have mating electrical connectors that connect the powered unit to a first cable of the electrical-power bus. Preferably, the second channel and the second plug have mating electrical connectors that connect the powered unit to a second cable of the electrical-power bus.

For instance, the docking port has an insert adopted to receive a third plug on the powered unit, and a bolt passing through the third plug to screw into the insert.

BRIEF DESCRIPTION OF DRAWINGS

FIG. 9 is a perspective representation of a docking port for receiving a powered unit.

DESCRIPTION OF EMBODIMENTS

Several embodiments of the invention are described in the following with reference to the drawings.

Figure 1:
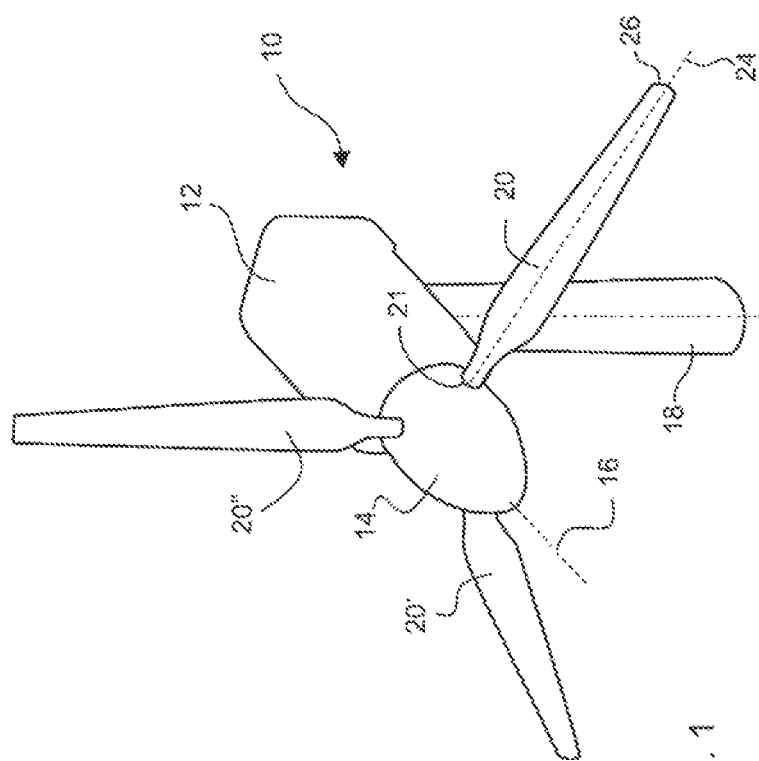
FIG. 1 is a perspective representation of a wind turbine.

A wind turbine 10 (FIG. 1) comprises a tower 18, supporting a nacelle 12, and a hub 14 rotationally attached to the nacelle to allow revolution about a rotor axis 16. Blades 20, 20', 20" are attached to the hub 14 at a blade root 21. The length of the blade 20 defines a blade axis 24 that extends essentially radially from the hub 14, and a bearing connects the blade root 21 to the hub 14 to allow blade rotation along or about the blade axis 24.

Figure 2:
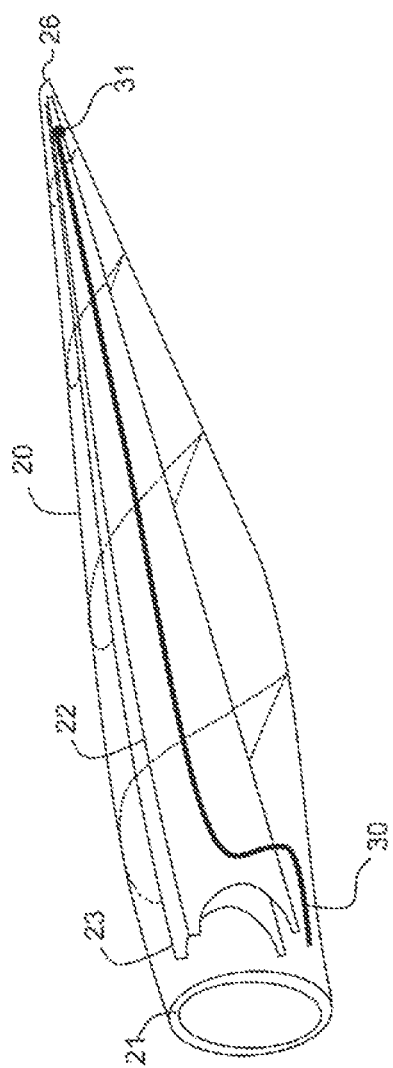
FIG. 2 is a perspective representation of a rotor blade of the wind turbine.

As is known in the art, the wind turbine blade, 20 (FIG. 2), comprises one or more spars, 22, 23, running along the length of the blade. Additionally, a down-wire, 30, connects a lightning receptor, 31, to a further circuit running through the wind turbine, 10, down to the ground. During a lightning strike, the lightning connects to the lightning receptor, and a large current flows through the down wire, down to the ground. Due to the danger of flash over, additional conductive material in the blade is normally not allowed, especially if the additional conductive material is connected to the electrical system of the wind turbine.

Figure 3:
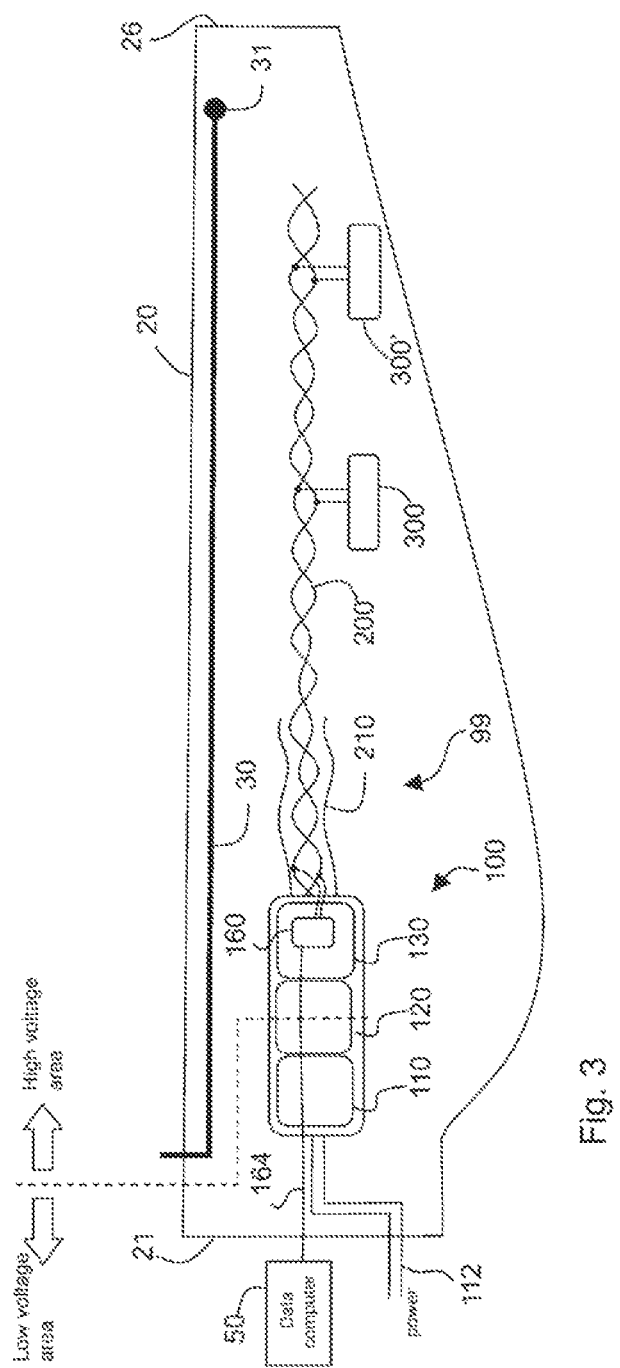
FIG. 3 is a schematic view of a blade electrical system according to a first embodiment of the invention.

The invention comprises a blade electrical system 99 (FIG. 3) that takes power from the hub, 14, and safely transmits power into the blade, 20, to areas located between the blade root 21 and the blade tip 26, or more preferentially to areas all along the blade 20, from the blade-root 21 up to the neighborhood of the blade-tip 26. The electrical system 99 is adapted to safely resist and overcome lightning strikes to the blade 20, and insure that no detrimental voltages caused by the lightning strike pass through the blade electrical system 99 onto the electrical or communication systems in the hub 14. Preferably, the blade electrical system 99 comprises sensors, electrically fed by the blade electrical system 99, for measuring blade physical quantities. Preferentially, the blade electrical system 99 comprises electrical control and actuation units that actuate and control fluidic systems, such as pneumatic and hydraulic systems, for the controlled movement of blade aerodynamic appendages.

The blade electrical power system comprises three main components:
  a) A power-transfer unit, 100, capable of safely transferring power across a large voltage potential, including the voltage potential between the blade's electrically conductive down-wire 30 and ground. The power transfer unit 100 has a power-driver unit, 110, receiving electrical power from the turbine's electrical grid in the hub 18, via supply cables 112, and further has a power-conditioner unit, 130, that supplies electrical power into an electrical-power bus, 200, that extends into the blade 20. The power-conditioner unit, 130, receives the energy necessary for operation from the power-driver unit, 110.

The power-transfer unit, 100, further comprises a dielectric 120, located between the power-driver unit 110 and the power-conditioner unit 130, for the purpose of electrically isolating these two units, as well as encompassing the entire power-transfer unit 100. In particular, the dielectric 120 separates and isolates the power-driver and conditioner units with a dielectric material capable of suppressing any electrical conduction, and flash-over, when the power-conditioner unit 130 is raised to a large voltage potential, relative to the power-driver unit, 110, such as the voltage potential established during a lightning strike;
  b) A electrical-power bus, 200, to carry the power from the power-transfer unit 100; and
  c) Powered units, 300, 300', receiving the power from the electrical-power bus 200, and performing a desired function, including, but not limited to, sensing predetermined blade physical values, and performing activation, control, and motion functions in electro-mechanical systems.

Preferably, the blade electrical power system comprises powered units 300 that communicate with a communication unit 160, inside, or near the power-transfer unit 100, and a communication link 164, for communication between the communication unit 160, and one or more data computers 50 in the wind turbine. The communication link also withstands the large voltage potential during a lightning strike without allowing electrical conduction. For instance, the communication link is a fiber-optic cable.

The dielectric 120 divides the blade 20 into two areas, a "high voltage area" characterized by the presence of, or risk of exposure to, high voltage from lightning strikes, and a "low voltage area", typically near the blade root and in the hub, characterized by a very low probability of exposure to high lightning induced voltage.

As an example of dimensions, the power-transfer unit 100 supports 6 to 10 powered units 300, each consuming about 10 Watts. The power-transfer unit 100, thus, is adopted to feed a power of 60 to 100 Watts into the electrical-power bus, 200.

Power-Transfer Unit.

The function of the power-transfer unit 100 is to transfer electrical power available at, or near, the blade root, 21, to the electrical-power bus 200 in the blade 20, while isolating (hence protecting) the supply cables 112, and, thus, the electrical-power supply at, or near, the blade root 21, and the remainder of the wind turbine 10, from the high voltage potential created inside the blade 20 by a lightning strike. As an example of an estimate of this high-voltage potential, we can assume a representative down-wire resistance R of 2 milli-Ohms per meter and inductance L of 0.2 micro-Henries per meter, a down-wire distance of 150 meters, and a lightning current surge of 200 kAmps in 50 micro seconds, yielding a voltage with respect to ground of 150*(Ri+(di/dt)*L)=180 kV. The dielectric, thus, should be rated at 200 to 400 kV, and most preferably, 1 MV.

The dielectric 120 comprises a separation part 122, located between the power-driver unit 110 and the power-conditioner unit 130, and generally axially aligned with the power-drive unit 110 and the power-conditioner unit 130, for the purpose of electrically isolating these two units. The dielectric 120 further comprises a surrounding part 121 which forms a housing, encompassing the entire power-transfer unit 100, for the purpose of preventing a flash-over from the electrical-power bus 200 to the supply cables 112. In particular, the linear extent of the surrounding part 121 extends at least the distance in air that provides a dielectric strength equal to that provided by the separation part 122.

For example, assuming a dielectric strength of air of 3 MV/m, then a surrounding part 121 length of 0.5 meter generates at least one meter distance in air between the electrical-power bus 200 and the supply cables 112, thereby providing about 1.5 million volts of dielectric strength.

Figure 4:
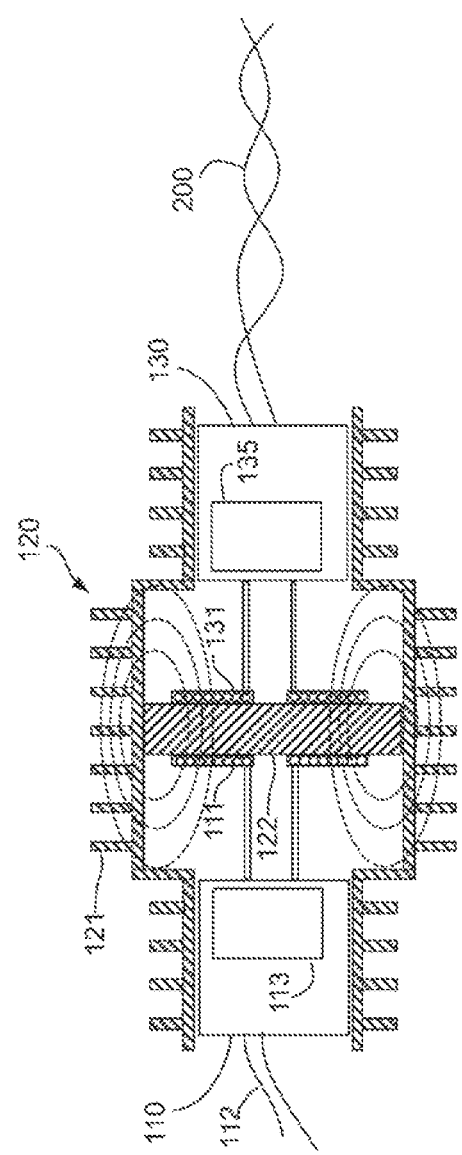
FIG. 4 is a schematic view of a power-transfer unit of the blade electrical system according to a first variant of the invention.

According to a first variant of the invention (FIG. 4), the power-driver unit 110 comprises a first coil, 111, the power-conditioner unit 130 comprises a second coil, 131, and the dielectric separation part 122 is a material of high dielectric strength, such as, for example, Teflon, so as to minimize the separation distance between the first and second coil, while providing the necessary protection against flash over and electrical conduction from the first and second coils. For example, 50 mm of Teflon provide dielectric strength of more than 1 million volts. An alternating current with a predetermined frequency is produced by a coil-driver 113, passed through the first coil 111 to induce a time varying voltage and/or current into the second coil 131, and this current is passed to a rectifier 135 to produce direct current in the electrical-power bus, 200. Preferentially, the first 111 and second 131 coils form a resonant system, with resonant frequency f0, and the frequency of the current produced by coil-driver 113 is chosen to equal f0. The establishment of a resonant coil system maximizes the efficiency of power transfer, and reduces any stray magnetic field emitted by the power transfer unit.

Figure 5:
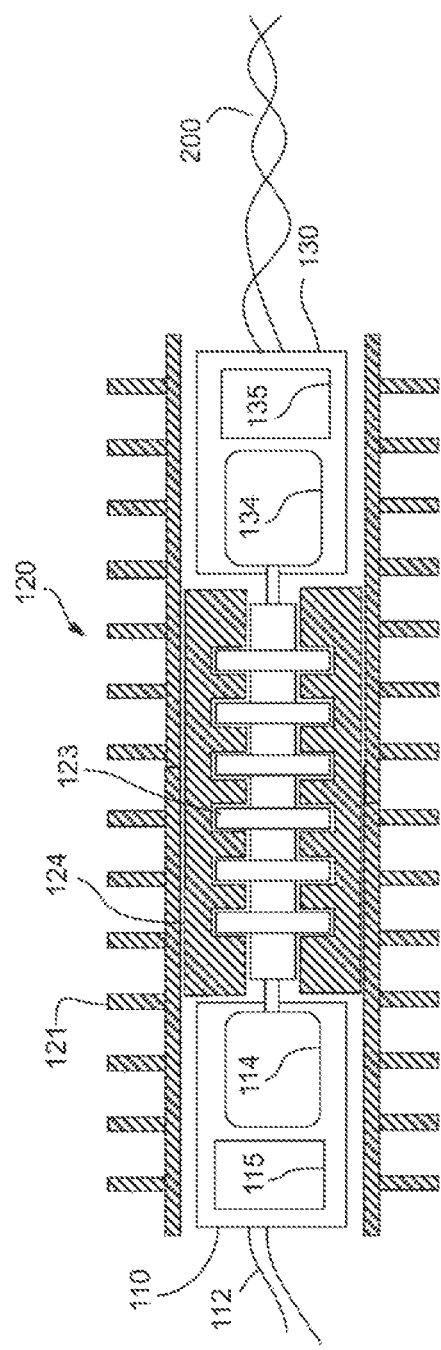
FIG. 5 is a schematic view of a power-transfer unit of the blade electrical system according to a second variant of the invention.

According to a second variant of the invention (FIG. 5), the power-driver unit 110 comprises an electrical motor, 114, driven by a motor-driver 115. The power-conditioner unit 130 further comprises an electrical generator 134, rotationally coupled to the electrical motor 114 and driven by the electrical motor 114 to generate electrical voltage and/or current. The separation part takes the form of an insulating shaft 123 made of a material simultaneously possessing high material strength and high dielectric strength. The insulating shaft 123 rotationally couples the electrical motor 114 to the electrical generator 134. The insulating shaft 123 is made of a material with high dielectric strength, such as, for example, Teflon, so as to minimize the separation distance between the first and second motors, while providing the necessary protection against flash over and electrical conduction from the first and second motors. To further hinder the flash-over process, the electrical isolator or dielectric 120 further comprises a volume filler 124 that surrounds the insulating shaft, leaving only a small air gap between itself and the shaft. According to a modification, the gap between the volume filler 124 and the insulating shaft 123 is filled with electrically isolating oil.

As is known in the art, the blade's pitch angle, measured relative to the rotor axis 16, varies during the operation of the wind turbine 10. During the power-generation mode of the wind turbine 10, the blade's pitch angle Θ measured with respect to the hub 14, is either at one nominal value, $Θ_0$, at wind speeds below a rated wind speed, or differs by up to 10 to 20 degrees from the nominal value $Θ_0$ when the wind is above the rated wind speed. Since the power-transfer unit 100 is fixedly attached to the blade 20, the power-transfer unit 100 also rotates by the pitch angle Θ, with respect to the hub 14. Most preferably, the insulating shaft 123 is oriented parallel to the rotor axis 16, when the blade pitch angle is at the nominal value $Θ_0$. This selection of orientation minimizes the gyroscopic forces on the insulating shaft 123 generated by the rotation of the blade 20 about the rotor axis, 16.

Electrical-Power Bus.

The electrical-power bus 200 has the function to transfer electrical power from the power-conditioner 130 in the power-transfer unit 100 to the powered units, 300, 300', located inside the blade, 20.

Preferentially, the electrical-power bus 200 comprises a pair of twisted cables. This topology minimizes the generation of induced voltages in the twisted pair when the electrical-power bus 200 is exposed to a time varying magnetic field. Most preferentially, the twisted pairs are surrounded by a metallic shield 210, to form a shielded, twisted-pair cable, as known in the art.

In a first embodiment (FIG. 3), the electrical-power bus 200 is located in the wind-turbine blade 20 along a path that maintains a minimum predetermined distance from the blade's down-wire 30, and is not in electrical connection with the down-wire 30. This embodiment is possible when the presence of the electrical power bus 200 is compatible with the functionality of the blade's lightning protection system.

Figure 6:
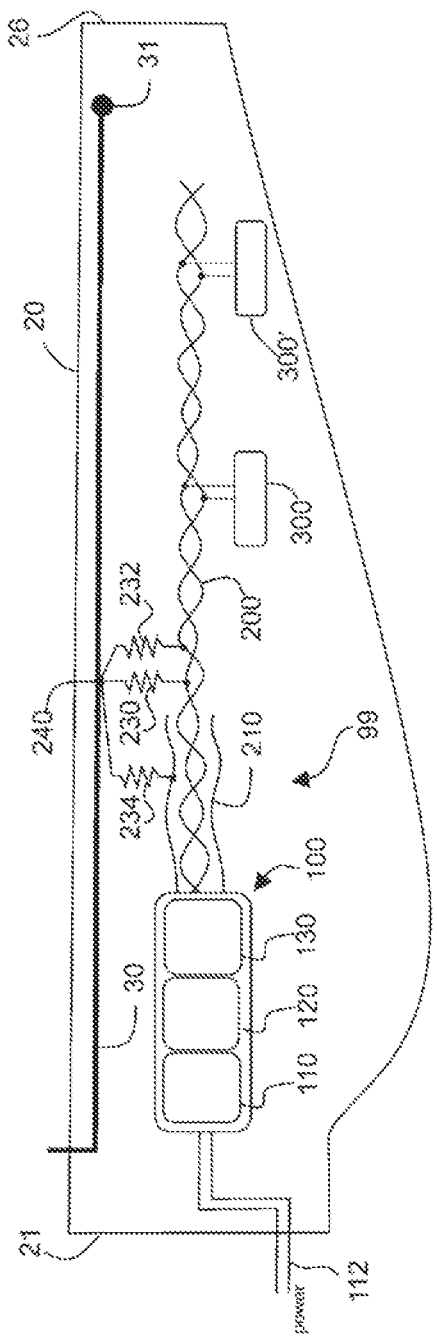
FIG. 6 is a schematic view of a blade electrical system according to a second embodiment of the invention.

In a second, and preferred, embodiment (FIG. 6), the electrical-power bus 200 runs essentially parallel and in the neighborhood of the down-wire, 30, at a distance to the down-wire 30 that is much smaller than the length of the blade 20. For example, at a distance of a few centimeters. Each one of the twisted-pair cables is electrically connected to the down-wire 30 at a first or common connection-point 240 using a resistive connection. In particular, if we denote by R1 the value of resistance in a first resistive connection 230 between the first twisted-pair cable and the down-wire, and by R2 the value of resistance in a second resistive connection 232 between the second twisted-pair cable and the down-wire 30, then, during normal operation, characterized by an absence of lightning strike on the blade, a pre-selected voltage V between the twisted-pair cables, such as, for example, V=24 Volts, will create a "leakage current" of V/(R1+R2) Amps between the twisted-pair cables. This leakage current is part of the normal operation of the electrical power system. In the second embodiment having a metallic shield 210 surrounding the twisted-pair cables, a third resistive connection 234 connects the metallic shield 210 to the down-wire 30 at the first or common connection point 240. The third resistive connection 234 guarantees that the voltage potential between the metallic shield and each of the twisted-pair cables remains essentially zero during a lightning strike.

During a lightning strike, a surge of high current passes through the down-wire 30, and the voltage at the first connection point 240, which we denote Vs, will rise to high values with respect to the ground. The first resistive connection 230 raises the voltage potential of the first twisted-pair cable to essentially Vs, and the second resistive connection 232 raises the voltage potential of the second twisted-pair cable to essentially Vs, as well. Only a very small amount of current passes through the first and second resistive connections during the lightning strike, since the dielectric 120 in the power-transfer unit 100 blocks any current flow from the twisted-pair cables to ground. Consequently, the voltage potential between the twisted-pair cables remains very small in comparison to the voltage potential between the down-wire and the turbine's ground, thereby preventing overvoltage from damaging the powered-units 300.

A differential voltage potential between the electrical-power bus 200 and the down-wire 30 will exist at locations in the blade that are different from the first or common connection point 240, due to the voltage created by the large lightning current passing through a small, but non-zero, inherent resistance of the down-wire 30 itself. This differential voltage potential is prevented from causing currents in the electrical power bus 200 by encapsulating the shielded, twisted-pair cable in an isolator, such as plastic, as is well known in the art. In particular, we note that the first 230 and second 232 resistive connections guarantee that the maximum differential voltage between the electrical-power bus 200 and the down-wire 30 does not exceed Vm, namely the voltage computed as the product of current in the down-wire and the resistance of the down-wire present between the first connection point 240 and the lightning attachment point 31. For example, a current of 50 kA running through a down-wire with 1 milli-Ohm resistance per meter, and a distance between the connection point and the lightning attachment point of 80 meters yields a differential voltage of 50,000*80*0.001=4000 V. Insulated cabling able to handle this voltage level is \Nell known in the art.

Powered Units

Powered units 300, 300', are units electrically attached to the electrical-power bus 200, and running on the electrical power supplied by the electrical-power bus, Particularly, powered units 300 comprise sensors for sensing at least one physical quantity associated with the blade, such as a physical quantity associated with the blade at the location of the sensor. Preferably, the sensor in the powered-unit 300 comprises a first gyroscope measuring the magnitude of a rotational vector along a first gyroscope axis, where said rotational vector is created by the rotational motion of the blade 20 and hub 14 about the rotor axis 16. Preferentially, the sensor in powered unit 300 comprises a second gyroscope measuring the magnitude of said rotational vector along a second gyroscope axis, wherein the first and second gyroscope axis are linearly independent, and preferably essentially orthogonal. For instance, the sensor further comprises a multi-axis accelerometer measuring the projection of the acceleration vector, generated by the combination of centripetal acceleration due to the blade's rotation and the Earth's gravity, along linearly independent axis, such as a three-axis accelerometer known in the art.

In particular, the powered unit or powered units 300, 300', incorporate one or more pressure-sensors for measuring the air pressure at predetermined locations on the outer surface of the blade. Preferentially, the pressure sensor is a differential pressure sensor measuring the difference in air pressure between two selected locations on the outer surface of the blade for the purpose of identifying the aerodynamic state of the airflow about the blade. Preferably, the powered unit or powered units 300, 300' include an inductive and capacitance sensor positioned near the outer surface of the blade 20. The powered unit or powered units measure changes in the impedance of the inductive and capacitance sensor due to the presence of water and ice on the blade's external surface.

In particular, the powered unit 300 communicates with the communication unit 160 located in or near the power-transfer unit 100. The communication preferably includes the values of the sensing signals measured by the powered unit 300. According to a first possibility, the communication occurs over a dedicated cable, preferably a fiber-optic cable, that runs parallel to the electrical-power bus 200. According to a second possibility, the communication occurs via wireless data transfer. According to a preferred possibility, having lower manufacturing costs, the communication is performed directly over the twisted cables of the electrical-power bus 200. For example, the communication signals are modulated at a predetermined high frequency, so as to be easily separated by the communication unit 160 from the lower frequency signals associated with the transfer of electrical power. In particular, the communication between the communication unit 160 and each powered unit 300 is bi-directional.

The communication unit 160 further communicates with a data computer 50 in the wind turbine using the communication link 164. The data computer can be, for example, a dedicated computer for the purpose of collecting and processing the powered unit 300 measurements, or can be the turbine's own programable-logic controller, or any other electronic device adapted to receive the communication signal from the powered unit 300. Additionally, the turbine's operation can be changed or optimized based on the signals produced by the powered unit or powered units, such as, for example, operation to minimize blade loads, maintain a safe blade-tip to tower clearance, and capture more wind energy.

The communication link 164 is non-electrically-conductive so as to isolate the data computer 50, and other equipment in the wind turbine from the high voltage potential present in the power-conditioner unit 130, and the communication unit 160 during a lightning strike. According to a first possibility, the communication link 164 is a fiber-optic cable. According to a second possibility, the communication link 164 uses wireless signals.

Figure 7:
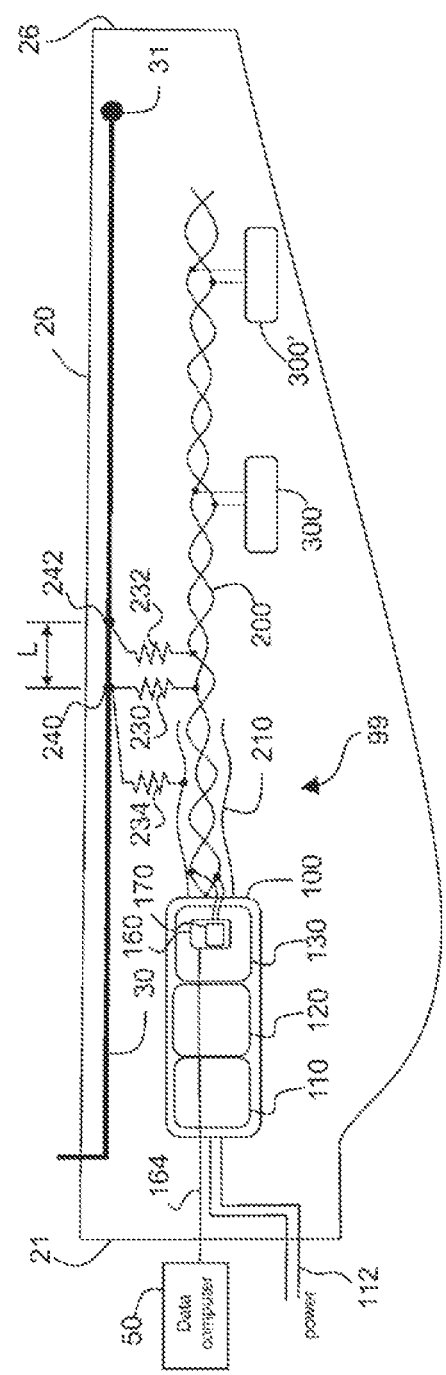
FIG. 7 is a schematic view of a blade electrical system according to a third embodiment of the invention.

In a third embodiment of the invention (FIG. 7), the blade electrical power system comprises a lightning detector and lightning-current measuring system 170, preferably located in, or near, the power-conditioner 130. The lightning detector and lightning-current measuring system 170 is in electrical contact with both twisted-pair cables in the electrical-power bus 200, and continuously measures a differential voltage potential between these twisted-pair cables. To make the differential voltage between the two twisted-pair cables indicative of the lightning induced current in the down-wire 30, the first resistive connection 230 is electrically connected to the down-wire 30 at the first connection-point 240, and the second resistive connection 232 is electrically connected to the down-wire at a second connection-point 242. The first 240 and second 242 connection points are spaced apart by a pre-determined distance, denoted by L in FIG. 7. The down-wire has a characteristic resistance, RL, measured in Ohms per meter, associated with each unit of length along the down-wire, so that, over the distance "L", the down-wire has a resistance "RL*L". During a lightning event, the large current "I" carried by the down-wire creates the differential voltage, VR, between the first and second connection points proportional to the product of the current and the down-wire resistance, "VR=I*RL*L", plus a further contribution from the self-inductance of the wire, di/dt L. This differential voltage is measured by the lightning detector and lightning-current measuring system 170, and the current signal "i(t)" computed from the known down-wire properties and the voltage signal in time.

There is also an additional, but lower, differential voltage contribution from the induced voltage created by the lightning induced, time-varying, magnetic flux over the loop area formed by the twisted-pair cables, the first and second resistive connection, and the down-wire. Accordingly, this effect is also included in the calculation of the current, i(t).

The lightning detector and lightning-current measuring system 170, abbreviated LDLM herein, monitors, in an essentially continuous manner, the differential voltage between the two twisted-pair cables, and computes the current in the down-wire 30 from the measured voltage difference, VR, plus any necessary corrections due to wire self-inductance, and magnetic induction effects, as well as changes in down-wire resistance, RL, due to temperature rise accompanying the current flow.

Actuation and Control

It is known in the art that an aerodynamic appendage attached to the wind turbine blade must be rotationally positioned by a positioning system in response to a positioning signal provided by the control system of the turbine. The positioning of the aerodynamic appendage must be rapid and precise, and must survive unharmed through lightning strikes. The positioning system comprises two functionalities: it must deliver sufficient mechanical power to rapidly move the appendage, and it must provide activation control and position measurement for verification of the positioning process.

Figure 8:
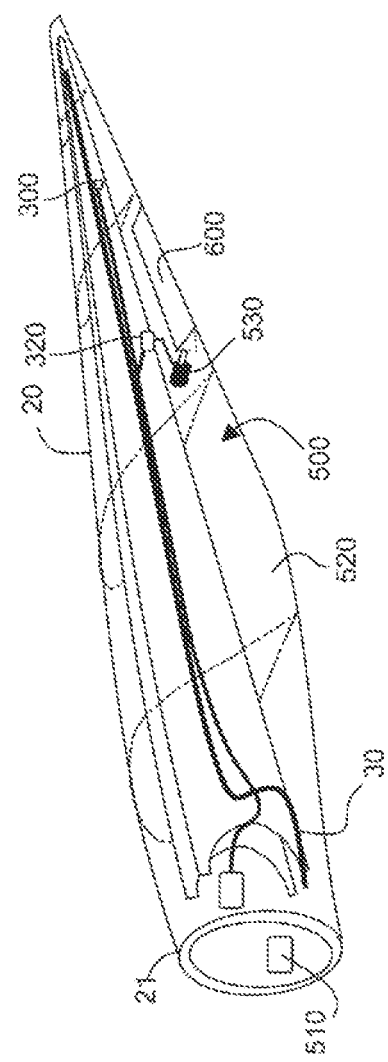
FIG. 8 is a perspective representation of a rotor blade of the wind turbine, the blade having an aerodynamic appendage.

According to a possible configuration (FIG. 8), blade 20 is provided with an aerodynamic appendage, 600. Examples of aerodynamic appendage include flaps, ailerons, and Gurney flaps. The mechanical power needed for moving the aerodynamic appendage is supplied by a fluid-power system, 500. The fluid-power system delivers working fluid having fluid power to the location of the aerodynamic appendage via a fluid conduit 520. The working fluid and the material of the fluid conduit are chosen to have high dielectric strength and be electrically insulating, so as not to offer a path for electrical conduction both during normal operation, and during a lightning strike. According to a first possibility, the fluid-power system 500 is a hydraulic system, using oil or similar low-compressibility liquid as working fluid to transfer power. According to a second, and more preferred possibility, the fluid system 500 is a pneumatic system using compressed air as the working fluid to transfer power. Compressed air has the advantage of being non-polluting in case of leakage. The fluid-power system has a fluid compressor, 510, located in the "low voltage area", such as the blade root area 21, compressing the working fluid in the system.

The fluid-power system exerts mechanical force on the aerodynamic appendage using fluid-powered actuators 530 mechanically attached to the aerodynamic appendage, Particularly, the fluid-power system is controlled by a powered unit 300 located near the aerodynamic appendage. This arrangement having a small separation between aerodynamic appendage and the controlling powered unit 300 provides the necessary accuracy and speed in the activation control. For contrast, we note that controlling the fluid-powered actuators using fluidic control systems located in the "low voltage area" is not desirable or effective, because the large distance between the actuators and the fluidic control system is hampered by transients, delays, and resonances along the fluid conduit 520. Preferably, the fluid-powered actuators 530 and associated fluidic control systems are located at, or in the vicinity of, the aerodynamic appendage 600. The fluidic control system comprises powered units 300 adopted to electrically control valves, fluid-resistive elements and other fluid-control components to regulate the motion of the fluid-powered actuators 530. Most preferably, the powered unit 300 comprises position sensors indicative of the position of the aerodynamic appendage 600. For instance, the powered unit 300 uses the position sensor signal to perform closed-loop control of the fluid-power system to provide accurate positioning of the aerodynamic appendage.

Replaceability

To allow replacement of the powered unit 300 during the life-time of the blade, a preferred configuration of the invention (FIG. 9) has the powered unit 300 being readily detachable from the turbine blade. Herein, "readily detachable" describes the property of being able to be quickly detached by both a human and, in confined spaces, by a service robot, or a machine, adopted to detach and re-attach the powered unit to the blade.

To achieve the readily detachable functionality, the electrical-power bus 200 further comprises a docking port 320 fixedly attached to the blade structure, such as, for example, spar 22, and electrically connected to the electrical-power bus 200. The docking port 320 receives the powered unit 300, and a becomes fixedly attached to, and electrically connected to, the powered unit 300, thereby providing both mechanical support to the powered unit as well as provide electrical contact between the powered unit 300 and the electrical-power bus 200.

Preferably, the docking port 320 has a first channel 322 adopted to receive a first plug 362 on the powered unit, and a second channel 324 adopted to receive a second plug 364 on the powered unit.

The first channel 322 and first plug 362 have mating electrical connectors that connect the powered unit to the first cable of the electrical-power bus. Similarly, second channel 324 and second plug 364 have mating electrical connectors that connect the powered unit to the second cable of the electrical-power bus.

Additionally, the docking port has an insert 326 adopted to receive a third plug 366 on the powered unit 300, and a bolt 368 passing through the third plug to screw into the insert 326, so as to unite and fix the docking port 320 to the powered unit 300. The presence of the insert 326 and matching third plug 366 guarantees that the powered unit can only be attached to the docking port in one specific orientation, even in the case when first channel 322 and the second channel 324 are concentrically arranged. This "specific orientation" property is particularly important when the powered unit contains gyroscopes, accelerometers, or other sensors that measure a quantity along a predetermined axis or direction. The orientation of this axis with respect to a powered-unit casing, 360, is fixed "in the factory" at the time of assembly of the powered unit, and the orientation of this axis with respect to the blade is fixed by the docking-port configuration, thereby imposing and maintaining a known, predetermined orientation of the sensor's axis relative to the blade structure. Additionally an O-ring 363 seals the surface of the first channel 322 and the first plug 362, so as to prevent the entrance of water, or condensation, to the area of the docking port and the docking plug containing electrical contacts.

REFERENCE SIGNS LIST 10 wind turbine
12 nacelle
14 hub
16 rotor axis
18 tower
20 blade
20' blade
20" blade
21 blade root
22 spar
23 spar
24 blade axis
26 blade tip
30 down-wire
31 lightning receptor
50 data computer
99 blade electrical system 100 power-transfer unit
110 Power-driver unit
111 first coil
112 supply cables
113 coil-driver
114 electrical motor
115 motor-driver
120 dielectric/electrical insulator
121 surrounding part
122 separation part
123 insulating shaft
124 volume filler
130 power-conditioner unit
131 second coil
135 rectifier
160 communication unit
164 communication link
170 lightning-current measuring system
200 electrical-power bus
210 metallic shield
230 first resistive connection
232 second resistive connection
234 third resistive connection
240 first connection-point
242 second connection-point
300 powered unit
300' powered unit
320 docking port
322 first channel
324 second channel
326 insert
362 first plug
363 O-ring
364 second plug
366 third plug
368 bolt
500 fluid-power system
510 fluid compressor
520 fluid conduit
530 fluid-powered actuators
600 aerodynamic appendage

The invention claimed is:
1. A wind turbine comprising:
a hub (14) with electrical power therein;
at least one blade (20) attached to the hub;
the blade (20) having a blade root (21), a blade tip (26) and a down-wire (30) for the conduction of lightning current to the ground;
a blade electrical system (99) configured to receive electrical power from the hub (14) and to transmit the electrical power into the blade (20) to at least one area located between the blade root (21) and the blade tip (26), the blade electrical system (99) including:
  a power-transfer unit (100) comprising:
    a power-driver unit (110),
    a power-conditioner unit (130); and
    a dielectric (120) separating the power-driver unit (110) and the power-conditioner unit (130), and fully wirelessly electrically isolating and separating the power-driver unit from the power-conditioner;
  the power-driver unit (110) receiving electrical power from the hub (14) and transmitting the electrical power, through the dielectric (120) to the power-conditioner unit (130);
  an electrical-power bus (200) electrically attached to the power-conditioner unit (130) and extending into the blade (20); and
  at least one powered unit (300) electrically connected to, and being electrically powered by, the electrical-power bus (200).

2. The wind turbine (10) according to claim 1, wherein the dielectric (120) comprises:
a separation part (122) located between the power-driver unit (110) and the power-conditioner unit (130);
and a surrounding part (121), encompassing an entirety of the power-transfer unit (100).

3. The wind turbine (10) according to claim 1, wherein the power-driver unit (110) comprises:
a coil driver (113);
a first coil (111) connected to the coil driver (113);
wherein the power-conditioner unit (130) comprises a second coil (131) and a rectifier (135) connected to the second coil (131);
wherein the first (111) and second (131) coils are separated from one another by means of the dielectric (120);
wherein an alternating current with a predetermined frequency is produced by the coil-driver (113) and passed through the first coil (111) to induce a time varying voltage and/or current into the second coil (131); and
wherein the induced current is passed to the rectifier (135) to produce direct current in the electrical-power bus (200).

4. The wind turbine (10) according to claim 3, wherein:
the first (111) and second (131) coils form a resonant system having a resonant frequency; and
wherein the frequency of the current produced by coil-driver (113) is chosen to equal the resonant frequency.

5. The wind turbine (10) according to claim 1, wherein:
the power-driver unit (110) comprises a motor driver (115) and an electrical motor(114), driven by the motor-driver (115);
the power-conditioner unit (130) comprises an electrical generator (134) rotationally coupled to the electrical motor (114) and driven by the electrical motor (114) to generate electrical voltage and/or current; and
wherein the dielectric (120) comprises an insulating shaft (123) rotationally coupling the electrical motor (114) to the electrical generator (134).

6. The wind turbine (10) according to claim 5, wherein the separation part (122) comprises the insulating shaft (123).

7. The wind turbine (10) according to claim 5, wherein the hub (14) rotates about a rotor axis (16) and the insulating shaft (123) is oriented parallel to the rotor axis (16).

8. The wind turbine (10) according to claim 1, wherein the electrical-power bus (200) comprises a pair of twisted cables.

9. The wind turbine (10) according to claim 8, wherein the pair of twisted cables is surrounded by a metallic shield (210).

10. The wind turbine (10) according to claim 8, wherein each said cable of the pair of twisted cables is electrically connected to the down-wire (30) at a first connection-point (240) using a resistive connection (230,232).

11. The wind turbine (10) according to claim 8, wherein:
a first cable of the pair of twisted cables is electrically connected to the down-wire at a first connection-point (240) using a first resistive connection(230);
a second cable of the pair of twisted cables is electrically connected to the down-wire at a second connection-point (242) using a second resistive connection (232); and wherein the first (240) and second (242) connection points are spaced apart by a pre-determined distance (L).

12. The wind turbine (10) according to claim 11, wherein the blade electrical power system (100) comprises:
   a lightning detector and lightning-current measuring system (170); and
   wherein the lightning detector and lightning-current measuring system (170) is in electrical contact with both of the cables of the pair of twisted cables in the electrical-power bus (200).

13. The wind turbine (10) according to claim 10, wherein a third resistive connection (234) connects the metallic shield (210) to the down-wire (30) at the first connection point (240).

14. The wind turbine (10) according to claim 1, wherein:
   the powered unit (300) comprises at least one sensor for sensing at least one physical quantity associated with the blade (20).

15. The wind turbine (10) according to claim 1, wherein:
   the blade (20) is provided with an aerodynamic appendage (600);
   the mechanical power needed for moving the aerodynamic appendage is supplied by a fluid-power system (500); and
   the fluid-power system is controlled by the powered unit (300).

16. The wind turbine (10) according to claim 1, wherein:
   the electrical-power bus (200) comprises a docking port (320) fixedly attached to the blade at a point intermediate the blade root (21) and the blade tip (26), and electrically connected to the electrical-power bus (200);
   the docking port (320) receives the powered unit (300); and
   the docking port (320) provides both mechanical support to the powered unit as well as an electrical contact between the powered unit (300) and the electrical-power bus (200).

17. A method of forming a wind turbine, comprising:
   using a hub (14) to receive electrical power therein;
   securing at least one blade (20) to the hub, where the blade (20) has a blade root (21), a blade tip (26) and a down-wire (30) for the conduction of lightning current to the ground;
   using a blade electrical system (99) located within an interior area of the blade and configured to receive electrical power from the hub (14), and to transmit the electrical power to at least one area located between the blade root (21) and the blade tip (26), the blade electrical system (99) including:
      configuring the blade electrical system with a power-transfer unit (100) having:
         a power-driver unit (110),
         a power-conditioner unit (130), and
         a dielectric (120) fully wirelessly electrically isolating and separating the power-driver unit (110) and the power-conditioner unit (130);
      using the power-driver unit (110) to receive electrical power from the hub (14) and to transmit the electrical power through the dielectric (120) to the power-conditioner unit (130);
      using an electrical-power bus (200) electrically attached to the power-conditioner unit (130) and extending into the blade (20) to receive the electrical power from the power-conditioner unit; and
      using at least one powered unit (300) electrically connected to, and being electrically powered by, the electrical-power bus (200); and using the at least one powered unit to help control operation of the blade of the wind turbine.

18. A wind turbine comprising:
   a hub (14) with electrical power therein;
   at least one blade (20) attached to the hub;
   the blade (20) having a blade root (21), a blade tip (26) and a down-wire (30) for a conduction of lightning current to the ground;
   a blade electrical system (99) configured to receive electrical power from the hub (14) and to transmit the electrical power into the blade (20) to at least one area located between the blade root (21) and the blade tip (26), the blade electrical system (99) including:
      a power-transfer unit (100) comprising:
         a power-driver unit (110);
         a power-conditioner unit (130); and
         a dielectric (120) separating the power-driver unit (110) and the power-conditioner unit (130);
      the power-driver unit (110) receiving electrical power from the hub (14) and transmitting the electrical power, through the dielectric (120) to the power-conditioner unit (130);
   an electrical-power bus (200) electrically attached to the power-conditioner unit (130) and extending into the blade (20);
   at least one powered unit (300) electrically connected to, and being electrically powered by, the electrical-power bus (200); and
   the electrical-power bus (200) including a pair of twisted cables, and each one of the cables of the pair of twisted cables is electrically connected to the down-wire (30) at a first connection-point (240) using a resistive connection (230,232).

* * * * *